INVENTOR.
ANDREW F. BEER
BY
Frank R. Trifari
AGENT

INVENTOR.
ANDREW F. BEER
BY
[signature]
AGENT

United States Patent Office 3,436,623
Patented Apr. 1, 1969

3,436,623

INSULATED GATE FIELD EFFECT TRANSISTOR WITH PLURAL OVERLAPPED GATES

Andrew Francis Beer, Pound Hill, England, assignor to North American Philips Company, Inc., New York, N.Y., a corporation of Delaware Filed Dec. 22, 1966, Ser. No. 603,906
Claims priority, application Great Britain, Dec. 22, 1965, 54,333/65
Int. Cl. H01l *13/00*
U.S. Cl. 317—235 4 Claims

ABSTRACT OF THE DISCLOSURE

Insulated gate field effect and thin film transistors having plural overlapped gates to reduce the gate-drain capacitance. In a preferred arrangement, a signal gate does not overlap the source and drain, but a screening gate overlaps the latter.

This invention relates to a semiconductor device comprising a semiconductor body having a surface which is at least partly covered with an insulating layer, said body comprising a field effect transistor with insulated gate electrode with at least one source electrode and one drain electrode and with at least two gate electrodes which are provided on the insulating layer between the source and drain electrodes, said gate electrodes overlapping partly said source and drain electrodes. Examples of these devices are insulated gate field effect transistors and thin film transistors with double or multiple gate electrodes.

In operation in such devices a voltage is applied between the source and drain electrodes which biases the source electrode in the forward direction and the drain electrode in the reverse direction. Current flow between the source and drain electrodes may be initiated and controlled by a voltage applied between the gate electrodes and the underlying semiconductor body. This voltage is of such polarity that a current path formed by a surface channel of the other conductivity type as compared to the underlying body is induced under the insulating layer allowing current to flow between the source and drain electrodes. This mode of operation is referred to as the enhancement mode because the surface channel is formed by application of a voltage to the gate electrodes.

Such devices may be operated as a vacuum tube analogue. A modulating signal is applied to at least one gate electrode, the signal input gate, as a result of which a variation in the conduction of the surface channel and consequently in the source-drain current is obtained, whereas the other gate electrodes, the screening electrodes, ensure the extension of the surface channel over he entire source-drain distance.

In a known insulated-gate field effect transistor having a second gate disposed between the drain and the signal input gate, there is provided an intermediate surface region of the same conductivity type as the conductive surface channel which is situated under the gap between the two gate electrodes. This device has a relatively low gate-drain capacitance but has also a parasitic capacitance across the PN-junction between the intermediate surface regions and the underlying semiconductor body.

The device according to the present invention provides improved insulated gate field effect transistors and thin film transistors.

According to the invention a semiconductor device comprises a semiconductor body having a surface which is at least partly covered with an insulating layer, said body comprising a field effect transistor with insulated gate electrode with at least one source electrode and one drain electrode and with at least two gate electrodes which are provided on the insulating layer between the source and drain electrodes, said gate electrodes overlapping partly said source and drain electrodes and is characterized in that a first and a second gate electrode are separated by an electrically insulating layer and are at least partly overlapping so that in that part of the semiconductor body which is situated under said first and second gate electrodes a continuous current path may be obtained on application of voltages of the required polarity between the gate electrodes and the underlying semiconductor body.

A preferred embodiment of the invention is characterized in that the first gate electrode does not overlap the source and drain electrodes and that the second gate electrode overlaps both the source and the drain electrodes.

The insulating layer under the gates may consist in any suitable insulating material, for instance oxides or nitrides, which may be applied in different ways. However, according to an important preferred embodiment of the invention the insulating layer under the gate electrodes is an oxide layer of which at least the main part has been obtained by oxidation of the underlying semiconductor surface, for instance by thermal or electric oxidation.

The semiconductor body may consist of a polycrystalline layer, for instance in thin film transistors. In a further preferred embodiment of a semiconductor device according to the invention, the semiconductor body is a monocrystal.

According to another important preferred embodiment of the invention the source and drain electrodes are formed by zones of a conductivity type opposite to that of the remaining part of the body.

Finally, the invention relates to an electrical circuit comprising a semiconductor device as claimed in any of the preceding claims characterized in that means are provided for applying voltages between the said first and second gate electrodes and the underlying semiconductor body in order to produce said continuous current path.

Three embodiments of the invention will now be described by way of example with reference to the accompanying diagrammatic drawings, in which FIGURE 1 shows a vertical section of an insulated-gate field effect device according to the invention in which the conducting layers each extend over a rectifying junction;

Figure 1:
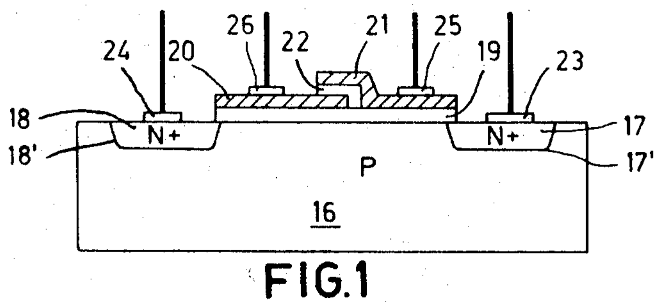
Figure 2:
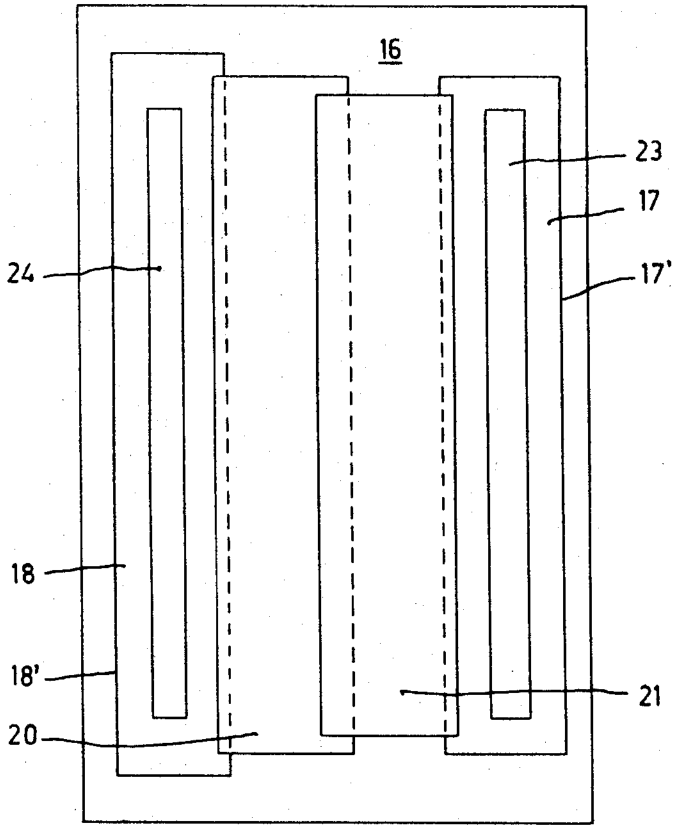
FIGURE 2 shows a plan view of the device shown in FIGURE 1.

The device shown in FIGURES 1 and 2 was prepared on a P-type monocrystalline silicon substrate 16 having a concentration of boron of $2\times10^{15}$ atom cc.$^{-1}$ and a specific resistivity of 7 ohm cm. The body may contain either active or passive elements formed within it or on one surface which together with the device form a solid state integrated circuit. Using an oxide masking photoresist technique two N+ surface regions 17 and 18 were formed on one surface of the body 16 and forming PN-junctions 17' and 18' with the body. The separation between the lines where the PN-junctions intersected the surface was 10 microns. A layer of silicon dioxide was grown over the surface of the body 16 at least between these two lines, thus the oxide may be grown over the whole surface and then removed over part of the diffused areas to enable ohmic contacts to be made to the areas. An aluminum layer 20 was then deposited on the oxide layer so that it extended over part of the exposed PN-junction 18' and approximately 5 microns towards the other exposed junction 17'. An oxide layer 22 was then deposited using tetraethoxysilane and another layer 21 of aluminum was deposited covering the oxide layer 22 and extending over at least part of the PN-junction 17'. The tetra-ethoxysilane was mixed with oxygen and led over the substrate which was heated to a temperature of approximately 400° C. The layers 22, 21 may be deposited over the whole surface of the substrate and then etched to cover the areas required. In this case the layer 20 of aluminum must be protected with a layer of gold on its upper surface to prevent its removal by etching. The device was completed by the placing of ohmic contacts 23, 24 on the diffused surface areas 17 and 18 and ohmic contacts 25, 26 on the conducting aluminum layers 21 and 20 respectively.

It will be appreciated that the oxide formed by decomposition of the tetra-ethoxysilane may extend over a large area of the aluminum layer 20 and it is only essential for it to extend over an area sufficient for the induced conducting layer in the semiconductor surface induced by a voltage applied to the aluminum layer 21 to overlap with the conducting layer induced by a voltage applied to the aluminum layer 20.

Figure 3:
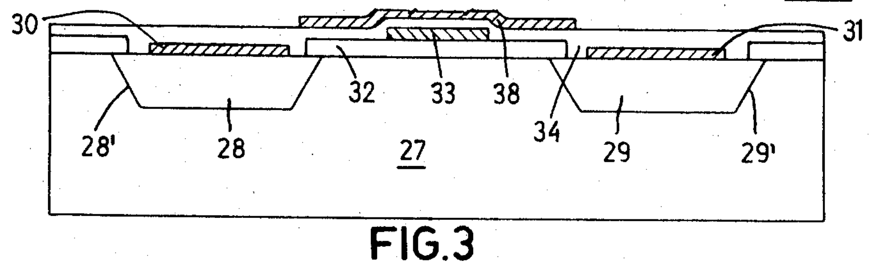
FIGURE 3 shows a vertical section through a device according to the invention in which one conducting layer does not extend over either rectifying junction.

Referring now to the device shown in FIGURE 3 the signal gate 33 is covered completely by but isolated from the screening gate 38. In this device the screening gate is used to form a conducting channel on either side of the signal gate and the signal gate is operated above the "knee" and amplification is achieved with a signal applied to this gate.

Figure 4:
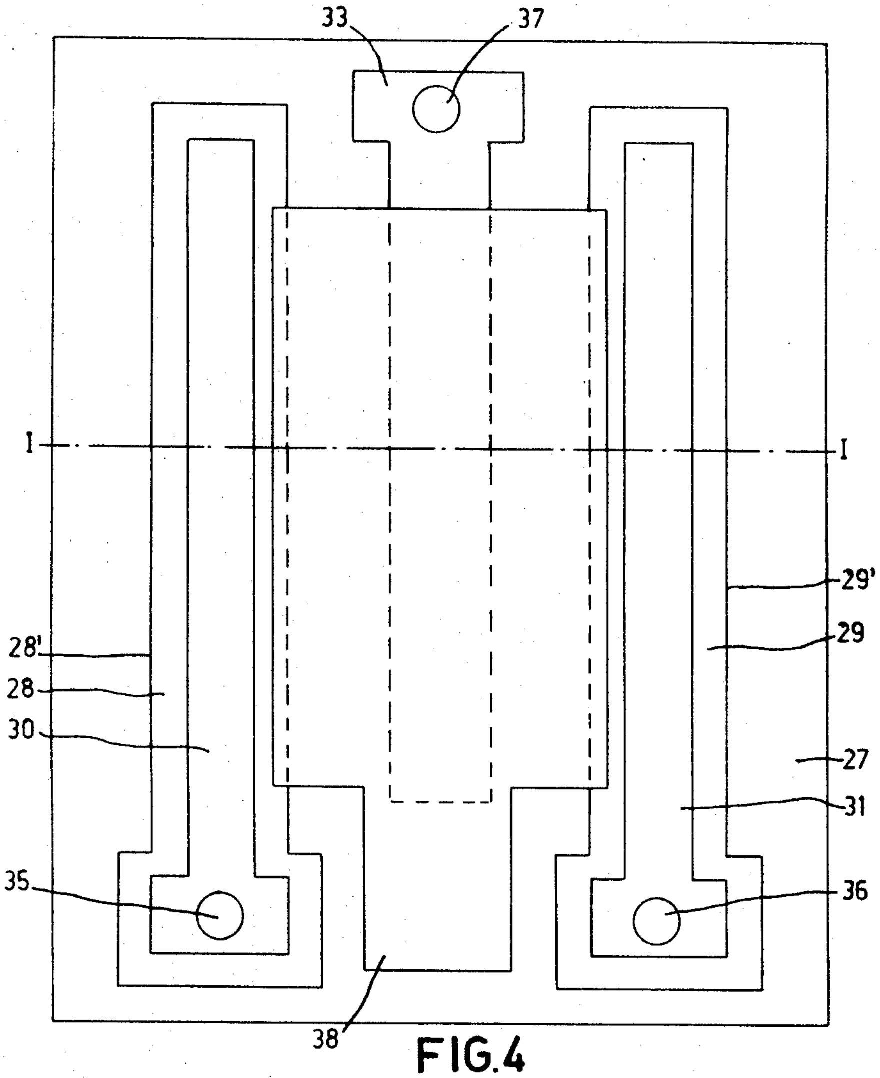
FIGURE 4 shows a plan view of the device shown in FIGURE 3.
Figure 5:
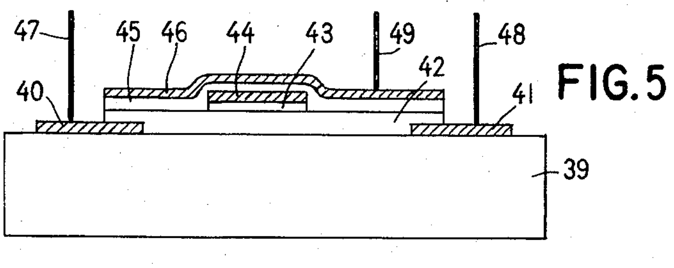
FIGURE 5 shows a thin film transistor according to the invention.

One method of forming the device illustrated in FIGURES 3 and 4 is as follows:

(1) The P-type monocrystalline silicon substrate 27 has an oxide layer 32 formed on its surface by the normal thermal oxidation techniques.

(2) Windows are cut in the oxide layer using a photoresist technique and N+ diffused areas 28, 29 are formed by diffusing phosphorus through the diffusion windows. The regions, 28, 29 form PN-junctions 28', 29' with the substrate 27. The spacing between the diffused regions is approximately 10 microns.

(3) Aluminum contacts 30, 31 are deposited in the windows in order to give ohmic contacts to the diffused regions. These aluminum contacts may be deposited by vacuum deposition through a mask or by depositing a layer of aluminum over the whole area of the substrate and removing the unwanted areas by a photoresist/etching technique. In the same process in which the aluminum contacts are deposited the signal gate 33, which consists of a layer of aluminum 3 microns wide deposited centrally between the diffused regions, may be formed.

(4) An oxide layer 34 is then deposited over the whole area of the substrate to a depth of 0.3 micron using a tetra-ethoxysilane decomposition process.

(5) Using a photoresist technique holes are etched in the oxide layer 34 above the positions 35, 36 and 37 in the aluminum contact areas 30, 31 and the signal gate 33 respectively. In the final processing of the device ohmic contacts may be made to the three aluminum layers through the respective holes.

(6) The screen electrode 38 is then deposited to cover the region on the substrate between the diffused regions 28 and 29. The screen gate being insulated from the signal gate 33 by the oxide layer 34.

The device is completed by making ohmic contacts to the diffused areas 28 and 29 which act as the source and drain of the device and making ohmic contacts with the two gate electrodes. The device may then be mounted on a header and encapsulated using conventional techniques.

It will be appreciated that one advantage of the devices according to the invention over known devices is the lower accuracy which is necessary to apply the gates to the device. Thus in FIGURE 1 the signal gate 20 must extend over the diffused surface area 18 to ensure that the induced surface conducting channel extends to that region. However, the edge of the signal electrode 20 nearest to the diffused surface region 17 has only to be defined with sufficient accuracy to give the device characteristic required; variations in this edge definition will affect the *gm* (mutual conductance) of the device but not the gate/drain (Miller) capacitance. The screen gate 21 must extend over the signal gate 20 and the surface region 17 but the actual positions where the screen gate electrode terminates are not of importance provided that the screen gate electrode is insulated from the signal gate electrode and the diffused surface region 17. Similarly in the device illustrated in FIGURE 3 the signal electrode 33 is not required to lie over the diffused regions 28, 29 and may occupy an approximately central position in the device without substantially altering the device characteristics.

The devices according to the invention in operation have a voltage applied to the screen gate electrode sufficient to induce a current carrying channel in the surface of the substrate, the current carrying channels connecting the signal modulated channel under the signal gate electrode with the diffused surface regions.

Variations in the position of the edge of the gate electrode 33 nearest to the PN-junction 28' alter the series resistance of the channel path between the source and drain which leads to variations in the *gm* of the device.

A thin film transistor according to the invention may be formed using the known techinques of preparing a thin film transistor and the techniques described previously for the preparation of insulated gate field effect transistors according to the invention.

An insulating glass substrate had gold stripes deposited on one plane surface with a spacing of 10$\mu$ between the stripes. A layer of polycrystalline cadmium sulphate 42 having a depth of 1$\mu$ was then deposited on the substrate.

A layer of silicon oxide 43 was then deposited using tetra-ethoxysilane. As described previously the signal electrode 44 consisting of aluminum was then deposited. The screening insulated gate electrode 45, 46 was then formed to overlap the source and drain electrodes.

Thus the invention provides improved insulated gate field effect transistors and thin film transistors having a reduced signal input to drain capacitance.

What is claimed is:

1. An insulated gate, field effect transistor comprising a semiconductive body comprising spaced source and drain electrodes defining a surface channel region, an insulating layer on the surface overlying the channel region, and a gate electrode system over the insulating layer and overlying the channel region for modulating the conductivity of said channel region, said gate electrode system comprising a first gate electrode overlying at least a portion of the channel region but laterally spaced from the source and drain electrodes, and a second gate electrode insulated from the first gate electrode and overlying the latter and also at least partially overlying the source and drain electrodes whereby a continuous current path may be established along the channel region between the source and drain electrodes upon application of voltages to the gate electrode system.

2. The invention of claim 1 wherein the first and second gate electrodes are insulated by an insulating layer on the first gate electrode.

3. The invention of claim 2 wherein the first gate electrode is centrally disposed between the source and drain electrodes.

4. The invention of claim 1 wherein the semiconductive body is a monocrystal, the source and drain electrodes are regions of the body of a conductivity type opposite to that of the body, and separate connections are provided to the first and second gate electrodes.

References Cited

UNITED STATES PATENTS

| | | | |
|---|---|---|---|
| 3,333,168 | 7/1967 | Hofstein ----------- | 317—235 |
| 3,339,128 | 8/1967 | Olmstead et al. ------ | 317—235 |
| 3,355,598 | 11/1967 | Tuska -------------- | 317—235 |

JOHN W. HUCKERT, *Primary Examiner.*
JERRY D. CRAIG, *Assistant Examiner.*